United States Patent [19]

King et al.

[11] Patent Number: 5,877,629
[45] Date of Patent: Mar. 2, 1999

[54] CORRECTION FOR MAXWELL FIELDS PRODUCED DURING NON-RECTILINEAR K-SPACE SAMPLING

[75] Inventors: Kevin F. King, New Berlin; Alexander Ganin, Whitefish Bay; Xiaohang Zhou, Pewaukee; Matthew A. Bernstein, Waukesha, all of Wis.

[73] Assignee: General Electric Company, Milwaukee, Wis.

[21] Appl. No.: 831,546

[22] Filed: Apr. 8, 1997

[51] Int. Cl.$^6$ ................................................. G01R 33/20
[52] U.S. Cl. ......................... 324/309; 600/410; 600/419
[58] Field of Search .................................. 324/309, 307, 324/306; 600/410, 419

[56] References Cited

U.S. PATENT DOCUMENTS

| 4,591,789 | 5/1986 | Glover et al. | 324/309 |
| 5,226,418 | 7/1993 | Bernstein et al. | 324/309 |
| 5,810,727 | 9/1998 | Groen et al. | 324/309 |

OTHER PUBLICATIONS

A Homogeneity Correction Method for Magnetic Resonance Imaging with Time–Varying Garadients, IEEE Transactions on Medical Imaging, vol. 10, No. 4, Dec. 1991, Noll, et al.

Deblurring for Non–2D Fourier Transform Magnetic Resonance Imaging, MRM 25, 319,333 (1992), Noll, et al.

Phase Errors In NMR Images, SMRM, p. 1037–1038, London 1985, Norris, No month.

EPI Spatial Distortion in Non–Transverse Plane, SMRM, Amsterdam 1989, Coxon, et al.

Reduction of concomitant Field Gradient Effects by Main Field Alternation, Proc. of the Soc. of Mag. Reson. in Med., vol. 1, p. 314, Nice France 1995, Claasen–Vujcic, et al., no month.

Image Distortion on Coronal Instant Images?, Book of Abstracts, Soc. of Mag. Reson. in Med., vol. 1, p. 457, New York New York, 1990, Weisskoff, no month.

Concomitant Magnetic Field Gradients and Their Effects on Image at Low Magnetic Field Strengths, MRI, vol. 8, pp. 33–37, 1990, Norris, et al., no month.

Nonaxial Wole–Body Instant Imaging, MRM 29:796–803 (1993), Weisskoff, et al., no month.

*Primary Examiner*—John Barlow
*Assistant Examiner*—Brij B. Shrivastav
*Attorney, Agent, or Firm*—Quarles & Brady, LLP

[57] ABSTRACT

Artifacts in NMR images produced by Maxwell terms during non-rectilinear scans, such as spiral scans, are reduced or eliminated. Phase corrections for in-plane and through-plane blurring are used to offset Maxwell terms errors.

10 Claims, 2 Drawing Sheets

CORRECTION FOR MAXWELL FIELDS PRODUCED DURING NON-RECTILINEAR K-SPACE SAMPLING

BACKGROUND OF THE INVENTION

The field of the invention is nuclear magnetic resonance imaging methods and systems. The invention relates to the correction of image artifacts caused by "Maxwell terms" arising from imaging gradients in MRI systems, and more particularly, to the correction of Maxwell phase errors produced by non-rectilinear k-space sampling methods such as spiral scanning, projection imaging and twisted radial line imaging.

When a substance such as human tissue is subjected to a uniform magnetic field (polarizing field $B_0$), the individual magnetic moments of the spins in the tissue attempt to align with this polarizing field, but precess about it at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that imperfections in the linear magnetic field gradients ($G_x$, $G_y$, and $G_z$) produce artifacts in the reconstructed images. It is a well known problem, for example, that eddy currents produced by gradient pulses will distort the magnetic field and produce image artifacts. Methods for compensating for such eddy current errors are also well known as disclosed, for example, in U.S. Pat. Nos. 4,698,591; 4,950,994; and 5,226,418.

It is also well known that the gradients may not be perfectly uniform over the entire imaging volume, which may lead to image distortion. Methods for compensating this non-uniformity are well known, and for example, are described in U.S. Pat. No. 4,591,789.

Other than uncompensated eddy current errors and gradient non-uniformity errors that escape correction, it can be assumed that the magnetic field gradients ($G_x$, $G_y$, and $G_z$) produce linear magnetic fields exactly as programmed, thus spatially encoding the NMR data accurately. With these gradients, the overall static magnetic field at location (x,y,z) is conventionally given as $B_0+G_x x+G_y Y+G_z z$, and the direction of the field is usually thought to be along the z-axis. This description, however, is not exactly correct. As long as a linear magnetic field gradient is applied, the overall magnetic field is nutated away from the z-axis and its amplitude exhibits higher-order spatial dependencies ($x^2$, $y^2$, $z^2$, $z^3$, ...). These phenomena are a direct consequence of the Maxwell equations which require that the overall magnetic field satisfy the following two condition: $\vec{\nabla}\cdot\vec{B}=0$ and $\vec{\nabla}\times\vec{B}=\vec{0}$. The higher-order magnetic fields, referred to as "Maxwell terms" (or Maxwell fields), represent a fundamental physics effect, and are not related to eddy currents or imperfection in hardware design and manufacture. Although Maxwell terms have been known for at least a decade, their effect on imaging has been largely ignored because of their minute amplitudes under conventional imaging conditions.

MR imaging methods may be categorized by the k-space trajectory used. Conventional, "rectilinear" MR imaging methods traverse k-space using a set of parallel lines which sample a rectangle in 2D or a parallelpiped (box) in 3D space. MR imaging methods which use substantially non-rectilinear k-space sampling include spiral scans, projection imaging, circular scans and twisted radial line imaging. One main difference between rectilinear and non-rectilinear sampling patterns is the type of artifacts which result. For substantially rectilinear k-space trajectories, the Maxwell fields cause ghosting and geometrical distortion but with non-rectilinear trajectories, blurring results. Correction methods for removing ghosting and geometrical distortion from the substantially rectilinear trajectories are available, but these methods are not appropriate for non-rectilinear trajectories because of the different nature of the artifacts.

SUMMARY OF THE INVENTION

The present invention relates to the reduction of image artifacts caused by Maxwell terms in NMR images produced using scans that employ non-rectilinear sampling of k-space. More specifically, the Maxwell phase errors are calculated using the scan specifications which indicate the location and orientation of the region to be imaged. The calculated phase errors may be employed to determine the current applied to a coil which offsets the high order Maxwell fields, or they may be used during acquisition of the NMR data to alter the reference frequency on the MRI receiver to offset the phase errors, or they may be used after acquisition to correct the phase of the acquired NMR data.

A general object of the invention is to reduce the blurring in NMR image caused by Maxwell fields. The phase errors produced by the Maxwell terms are systematically categorized as "through-plane" and "in-plane" effects. The phase errors caused by both effects are calculated based on the particular pulse sequence that is selected and the location and orientation of the region to be imaged. The particular correction strategy used to offset these phase errors also depends on the scan parameters.

A more specific object of the invention is to reduce the blurring in spiral scan NMR images caused by Maxwell fields. The calculated phase errors for through-plane effects are used to control the reference frequency of the MR system receiver during the readout of the NMR signals.

GENERAL DESCRIPTION OF THE INVENTION

Figure 1:
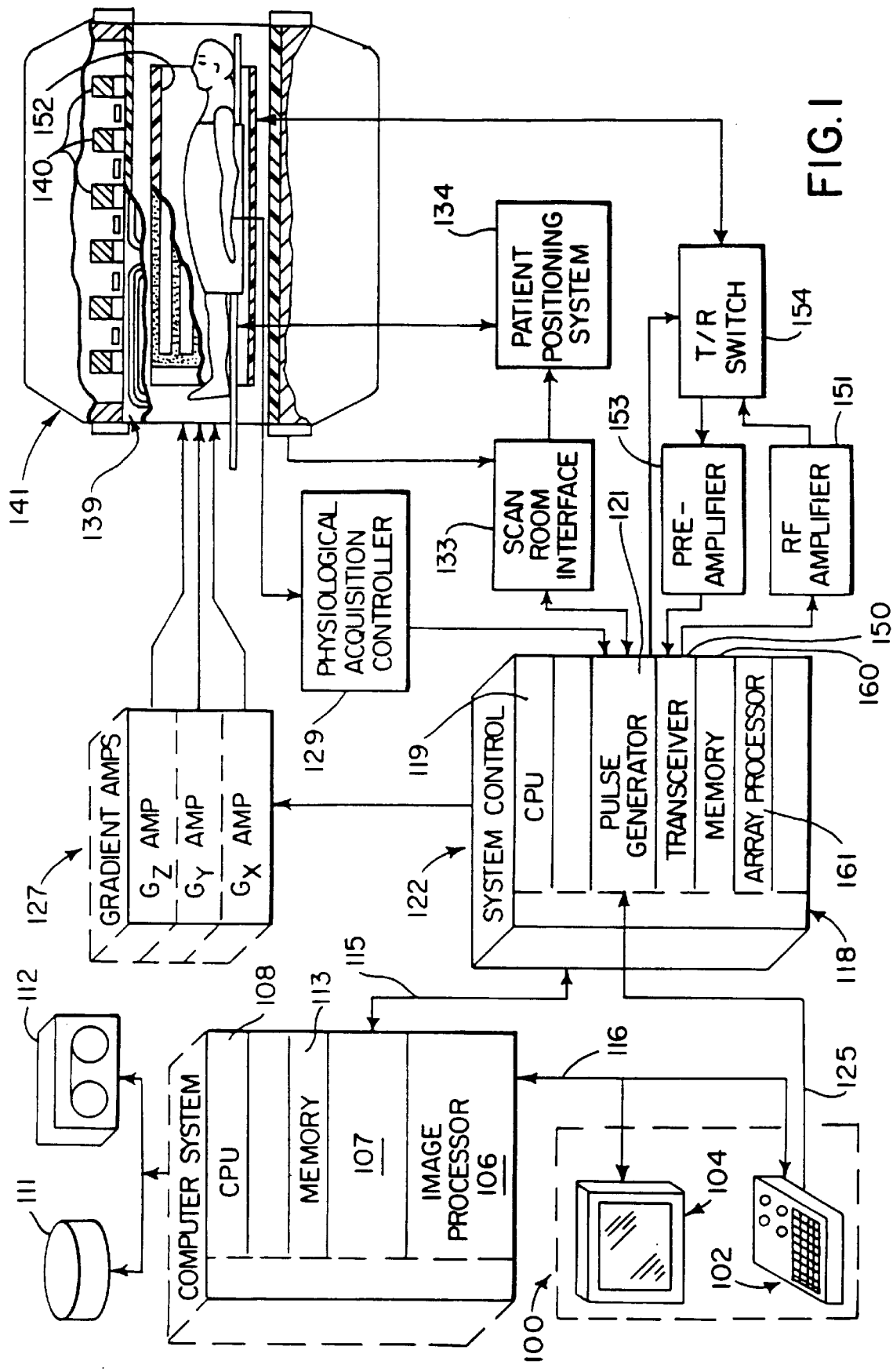
FIG. 1 is a block diagram of an MRI system which employs the present invention.

The Maxwell terms are basically the higher-order spatial gradients (second order, third order, etc.) produced by the linear magnetic field gradients (x, y and z-gradients). These terms can be directly derived from the Maxwell equations.

According to the Maxwell equations, a magnetic field $\vec{B}$ must satisfy the following two conditions:

$$\vec{\nabla} \cdot \vec{B} = 0 \quad \text{(divergence equation)}, \tag{1a}$$

$$\vec{\nabla} \times \vec{B} = \mu_0 \epsilon_0 \frac{\partial \vec{E}}{\partial t} + \mu_0 \vec{J} \quad \text{(curl equation)}, \tag{1b}$$

where $\vec{\nabla}$ is the derivative operator ($\vec{\nabla} = \hat{i}\partial/\partial x + \hat{j}\partial/\partial y + \hat{k}\partial/\partial z$), $\vec{E}$ is the electric field, $\vec{J}$ is the current density, and $\mu_0$ and $\epsilon_0$ are the magnetic permeability and the electric permeability of the free space, respectively. If there is no true current and the electric field is static, equation 1b reduces to:

$$\vec{\nabla} \times \vec{B} = \vec{0}. \tag{1c}$$

From equations 1a and 1c, we obtain:

$$\frac{\partial B_x}{\partial x} + \frac{\partial B_y}{\partial y} + \frac{\partial B_z}{\partial z} = 0, \tag{2}$$

$$\frac{\partial B_x}{\partial y} = \frac{\partial B_y}{\partial x}, \tag{3a}$$

$$\frac{\partial B_y}{\partial z} = \frac{\partial B_z}{\partial y}, \tag{3b}$$

$$\frac{\partial B_z}{\partial x} = \frac{\partial B_x}{\partial z}. \tag{3c}$$

The above 4 equations 2 and 3a-c contain a total of 9 partial derivatives, among which only 5 are independent. Our next task is to select these five independent variables. Recognizing that $$\frac{\partial B_z}{\partial x} = G_x, \frac{\partial B_z}{\partial y} = G_y, \frac{\partial B_z}{\partial z} = G_z$$

($G_x$, $G_y$, and $G_z$ are the linear gradients), we can readily choose $G_x$, $G_y$, and $G_z$ as the first three independent variables. For a radially symmetric $G_z$-field in cylindrical coordinates $\partial B_x/\partial x$ and $\partial B_y/\partial y$ should be identical. However, to cover a more general case, we choose a dimensionless symmetry parameter $\alpha$ as the fourth independent variable:

$$\alpha \equiv -\frac{\partial B_x/\partial x}{G_z}, \text{ or } 1 - \alpha \equiv -\frac{\partial B_y/\partial y}{G_z}. \tag{4a-b}$$

The last independent variable can be conveniently chosen as (based on equation 3a):

$$g \equiv \frac{\partial B_x}{\partial y} = \frac{\partial B_y}{\partial x}. \tag{5}$$

At this point, all the partial derivatives described in equations 2 and 3 can be expressed using the 5 independent variables $G_x$, $G_y$, $G_z$, $\alpha$ and $g$:

$$\begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} = \begin{bmatrix} -\alpha G_z & g & G_x \\ g & -(1-\alpha)G_z & G_y \\ G_x & G_y & G_z \end{bmatrix}. \tag{6}$$

With all the terms, the overall magnetic field becomes:

$$\vec{B} = \hat{i}B_x + \hat{j}B_y + \hat{k}B_z, \tag{7}$$

where, to first order, $$\begin{bmatrix} B_x \\ B_y \\ B_z - B_0 \end{bmatrix} = \begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} \begin{bmatrix} x \\ y \\ z \end{bmatrix} = \begin{bmatrix} -\alpha G_z & g & G_x \\ g & -(1-\alpha)G_z & G_y \\ G_x & G_y & G_z \end{bmatrix} \begin{bmatrix} x \\ y \\ z \end{bmatrix}. \tag{8}$$

The above equations have two important implications. First, the $B_0$-field is no longer aligned along the z-axis because of the transverse fields $B_x$ and $B_y$. Second, the amplitude of the $B_0$ field is not simply given by $B = B_0 + G_x x + G_y y + G_z z$, but instead by $$B(x, y, z) = \sqrt{B_x^2 + B_y^2 + B_z^2} \tag{9}$$

($B_0 + G_x x + G_y y + G_z z$ merely represents the z-component of the overall field). If we perform three sequential Taylor series expansions on equation 9 with respect to x, y, and z, respectively, it can be seen that the magnetic field not only has its regular zeroth and first order spatial dependencies, but also shows higher-order spatial components. The result of the Taylor expansion to the second order is given by equation 10:

$$B = B_0 + G_x x + G_y y + G_z z + \frac{1}{2B_0}[\alpha^2 G_z^2 + g^2]x^2 + \tag{10}$$

$$\frac{1}{2B_0}[(1-\alpha)^2 G_z^2 + g^2]y^2 + \frac{1}{2B_0}[G_x^2 + G_y^2]z^2 + \frac{gG_z}{B_0}xy +$$

$$\frac{1}{B_0}[gG_x - (1-\alpha)G_y G_z]yz + \frac{1}{B_0}[gG_y - \alpha G_x G_z]xz.$$

For gradient systems used in MRI, we have $g=0$, and $\alpha \approx 1/2$ (due to the cylindrical symmetry). Under these conditions, equation 10 reduces to:

$$B = B_0 + G_x x + G_y y + G_z z + \tag{11}$$

$$\frac{1}{8B_0} G_z^2 x^2 + \frac{1}{8B_0} G_z^2 y^2 + \frac{1}{2B_0}[G_x^2 + G_y^2]z^2 -$$

$$\frac{1}{2B_0} G_y G_z yz - \frac{1}{2B_0} G_x G_z xz.$$

Equations 10 and 11 indicate that, whenever a linear magnetic field gradient is applied, higher-order gradient fields will be produced to satisfy the Maxwell equations. These higher-order gradient fields are referred to as the "Maxwell terms", or "Maxwell fields."

With the inclusion of the Maxwell terms, the 2 D NMR signal equation becomes:

$$S(k_x, k_y) = \int\int_{x,y} \rho(x, y) e^{-i(k_x x + k_y y)} e^{-i\phi_M} dx dy, \tag{12a}$$

$$\phi_M = \gamma \int_t B_M(G_x, G_y, G_z, x, y, z) dt', \tag{12b}$$

-continued $$B_M = \frac{1}{8B_0} G_z^2 x^2 + \frac{1}{8B_0} G_z^2 y^2 + \quad (12c)$$

$$\frac{1}{2B_0} [G_x^2 + G_y^2]z^2 - \frac{1}{2B_0} G_y G_z yz - \frac{1}{2B_0} G_x G_z xz.$$

where $B_M$ is the Maxwell magnetic field and $\phi_M$ is the associated phase error. As implied by equation 12, the Maxwell phase error depends on the details of each pulse sequence. In some pulse sequences, the phase error can be zero and thus causes no image degradation. In most other sequences, a non-zero phase error is produced, giving various image quality problems such as distortion, ghosting, image shift, shading, blurring, and intensity reduction.

For non-rectilinear k-space sampling methods which use only the magnitude image (non-phase contrast methods), the main deleterious effect of the Maxwell field occurs during the readout where the field gives rise to additional time-varying phase of the precessing spins. The effects can be systematically categorized as "through-plane" and "in-plane" effects.

The "through-plane" effect can be understood by considering a 2 D axial scan in a superconducting magnet in which the image plane is perpendicular to the z-axis, the direction of the polarizing field $B_0$. During the readout, only the x and y gradients are active. From equation (12c), the additional Maxwell field to be corrected is $$B_M = \frac{z^2}{2B_0} (G_x^2 + G_y^2). \quad (13)$$

The additional field is non-zero for off-center slices where $z \neq 0$ and increases proportionally to the square of the readout gradient amplitude.

This through-plane Maxwell error can be corrected by removing the unwanted phase from the acquired data. The phase error $\phi_M(t)$ caused by the Maxwell terms is given by $$\phi_M(t) \approx \gamma \frac{z^2}{2B_0} \int_0^t (G_x^2 + G_y^2)dt', \quad (14)$$

where the approximation sign is used because we ignore phase variation over the width of the slice. This phase error is equivalent to a time dependent frequency offset given by $$f_M = \frac{(\gamma/2\pi)z^2(G_x^2 + G_y^2)}{2B_0}. \quad (15)$$

Correction for the Maxwell terms can be performed in several ways, including using a special coil which creates a field which nullifies the effect of the Maxwell field by making the total field uniform. Such coils are well known to those skilled in the art and are used for shimming to remove static magnetic fields with arbitrary spatial dependence. To correct for the Maxwell field, such a coil would have a time-dependent current whose behavior is determined by the time dependence of the Maxwell field in equation (13).

Correction can also be performed during data acquisition by shifting the frequency of the receiver by $f_M$. For spiral scans, the readout gradients are sinusoids with nearly constant amplitude, i.e. $G_x^2 + G_y^2 = G_0^2$ where $G_0$ is approximately constant during the readout. For axial spiral scans, therefore, the frequency offset $f_M$ is approximately constant during the readout and is given by $$f_M = \frac{(\gamma/2\pi)z^2 G_0^2}{2B_0} = \frac{\gamma z^2 G_0^2}{4\pi B_0}. \quad (16)$$

Correction can also be performed during reconstruction by multiplying the acquired k-space data by the factor $e^{i\phi_M(t)}$ given by equation (14).

The Maxwell term errors due to the "in-plane" effect can be understood by considering a 2 D sagittal scan in a superconducting magnet in which the image plane is perpendicular to the x-axis. During the readout only $G_y$ and $G_z$ are active. The additional Maxwell field from equation (12c) is:

$$B_M = \frac{x^2}{8B_0} G_z^2 + \frac{y^2}{8B_0} G_z^2 + \frac{z^2}{2B_0} G_y^2 - \frac{yz}{2B_0} G_y G_z. \quad (17)$$

Since the slice-select direction is along the x-axis, the first term in equation (17) is a through-plane term similar to the one just discussed for the axial scan case. The remainder of the terms in equation (17) depend on the location within the plane (hence "in-plane") and increase quadratically with the off-center distance and the amplitude of the readout gradient.

The in-plane error due to the Maxwell terms can be corrected by using a special coil or coils which creates a field that nullifies the time dependent and spatially dependent effect of the Maxwell field as discussed above.

The in-plane effect can also be corrected by applying corrections to the acquired data. These corrections have two main components referred to as the frequency segmented deblurring component as described by D. C. Noll, J. M. Pauly, C. H. Meyer, D. G. Nishimura, A. Macovski, Deblurring for Non-2 D Fourier Transform Magnetic Resonance Imaging, *Magn. Reson. Med.* 25, 319–333 (1992); and the time segmented deblurring component as described by D. C. Noll, C. H. Meyer, J. M. Pauly, D. G. Nishimura, A. Macovski, A Homogeneity Correction Method for Magnetic Resonance Imaging with Time-Varying Gradients, *IEEE Trans. Med. Imaging* 10, 629–637 (1991). Using the 2 D sagittal scan example above, a variation of the frequency segmented deblurring correction consists of multiplying the acquired k-space data by the factor $$e^{ia_l \int G_z^2(t)dt} e^{ib_m \int G_y^2(t)dt} e^{ic_n \int G_y G_z(t)dt}. \quad (18)$$

for a plurality of values of $a_l$, $b_m$ and $c_n$ followed by reconstruction of intermediate images for each such combination of values. The range of values chosen for $a_l$, $b_m$ and $C_n$ is determined by the values of the terms $\gamma y^2/(8B_0)$, $\gamma z^2/(2B_0)$ and $\gamma yz/(2B_0)$ appropriate for the field-of-view of the scan. The final image is formed by a combination of the intermediate images where the combination varies from pixel to pixel and is determined by the values of $\gamma y^2/(8B_0)$, $\gamma z^2/(2B_0)$ and $\gamma yz/(2B_0)$ for the pixel in question. Possible combination methods include nearest neighbor interpolation, linear interpolation, sinc interpolation and other methods well known to those skilled in the art.

Still referring to the sagittal scan example, a variation of the time segmented deblurring correction consists of dividing the acquired k-space data into a plurality of time intervals $(t_{i-1}, t_i)$ and reconstructing data from each time interval into an intermediate image. Each intermediate image is modified by multiplication by the following factor $$e^{i\gamma y^2/(8B_0) \int_0^{t_1} G_z^2(t)dt} e^{i\gamma z^2/(2B_0) \int_0^{t_1} G_y^2(t)dt} e^{i\gamma yz/(2B_0) \int_0^{t_1} G_y B_z(t)dt}. \quad (19)$$

This removes the Maxwell field phase error accumulated up to the end of the interval $t_i$. The modified intermediate images are added to form the final image. Appropriate values of the time intervals ($t_{i-1}$, $t_i$) depend on the details of the k-space trajectory used during the scan.

For spiral k-space trajectories, the deblurring corrections can be simplified with little loss of accuracy. For spiral scans, the readout gradients are sinusoids with nearly constant amplitude and varying frequency. The product term $\int G_y G_z dt$ oscillates with zero average amplitude whereas the quadratic terms $\int G_y^2 dt$ and $\int G_z^2 dt$ also oscillate but with linearly increasing average amplitude equal to $G_0^2/2$. For sagittal spiral scans, the Maxwell field is approximately equivalent to a spatially dependent frequency offset $f_M$ given by $$f_M = \frac{(\gamma/2\pi)G_0^2}{4B_0}\left(z^2 + \frac{y^2}{4} + \frac{x^2}{4}\right) \quad (20)$$

For 3D scans acquired using slice encoding, the through-plane and in-plane effects are also present. The through-plane effect produces additional unwanted phase variation over the encoded slab. Frequency segmented and time segmented deblurring can be used in the slice direction to remove the artifact. For 3D scans which do not use slice encoding, $G_x$, $G_y$ and $G_z$ are active during the readout. A separate through-plane correction for 3D scans is not possible, but frequency segmented and time segmented deblurring can be used to correct all Maxwell field artifacts.

In general for oblique scans, $G_x$, $G_y$ and $G_z$ are active during the readout. The correction methods described above can still be performed. By transforming equation (12c) into a logical coordinate system using rotation matrices, the Maxwell field can be corrected more easily than using the physical gradient amplitudes and coordinates.

For an arbitrary slice plane, we define a logical coordinate system as one rotated to align two coordinate axes within the slice plane and the third axis perpendicular to the slice plane. A blurring correction is most easily applied in the logical coordinate system. Let X, Y and Z be the logical coordinate axes. For the general oblique case, Maxwell blurring is equivalent to a frequency offset $f_M$ (X,Y,Z) given by:

$$f_M(X, Y, Z) = \qquad (21)$$
$$\frac{\gamma}{2\pi} \frac{G_m^2}{4B_0} (F_1 X^2 + F_2 Y^2 + F_3 Z^2 + F_4 YZ + F_5 XZ + F_6 XY),$$

where $G_m$ is the maximum value of readout gradient $G_0(t) = \sqrt{G_X^2 + G_Y^2}$ during the spiral readout and where the $F_i$ are constants derived below and which depend only on the scan plane rotation matrix. The frequency offset in equation (21) is applied for a time $T_{eff}(t)$ given by:

$$T_{eff}(t) = \frac{1}{G_m^2} \int_0^t G_0^2(t') dt'. \quad (22)$$

For example, for the sagittal scan case, $F_1=1$, $F_2=F_3=0.25$, $F_4=F_5=F_6=0$, giving $$f_M(X, Y, Z) = \frac{\gamma}{2\pi} \frac{G_m^2}{4B_0}\left(X^2 + \frac{Y^2}{4} + \frac{Z^2}{4}\right). \quad (23)$$

In this case, equation (23) is equivalent to equation (20), since the correspondence between logical and physical axes for a sagittal scan is X=z, Y=y, and Z=x.

A more rigorous derivation of the above equation (21) and the constants $F_i$ will now be described.

$$\phi_M = \frac{\gamma}{2B_0}\left\{\left(\frac{x^2+y^2}{4}\right)\int g_x^2 dt' + z^2 \int (g_x^2 + g_y^2) dt' - \right. \quad (24)$$
$$\left. xz \int g_x g_z dt' - yz \int g_y g_z dt' \right\},$$

where $B_0$, $g_x$, $g_y$ and $g_z$ are the static field and imaging gradients respectively, and x, y and z are the laboratory coordinates. $B_M$ will be determined in the logical coordinate system with coordinates (X,Y,Z) and gradient components ($G_x$, $G_y$, $G_z$).

The laboratory and logical coordinate systems are related by a rotation matrix A where $$A = \begin{pmatrix} a_1 & a_2 & a_3 \\ a_4 & a_5 & a_6 \\ a_7 & a_8 & a_9 \end{pmatrix}. \quad (25)$$

The logical and laboratory coordinates are therefore related by $$\begin{pmatrix} x \\ y \\ z \end{pmatrix} = \begin{pmatrix} a_1 & a_2 & a_3 \\ a_4 & a_5 & a_6 \\ a_7 & a_8 & a_9 \end{pmatrix} \begin{pmatrix} X \\ Y \\ Z \end{pmatrix}. \quad (26)$$

Similarly the gradient components are related by $$\begin{pmatrix} g_x \\ g_y \\ g_z \end{pmatrix} = \begin{pmatrix} a_1 & a_2 & a_3 \\ a_4 & a_5 & a_6 \\ a_7 & a_8 & a_9 \end{pmatrix} \begin{pmatrix} G_X \\ G_Y \\ G_Z \end{pmatrix}. \quad (27)$$

Inserting the coordinate relationships in equation (26) and (27) into equation (24) gives $$\phi_M = \frac{\gamma}{2B_0}(\phi_1 X^2 + \phi_2 Y^2 + \phi_3 Z^2 + \phi_4 YZ + \phi_5 XZ + \phi_6 XY), \quad (28)$$

where the $\phi_i$ are functions of the rotation matrix elements $a_i$ and integrals of the gradients $G_x$, $G_y$ and $G_z$. The terms $\phi_i$ in equation (28) were evaluated using Mathematica. Full details are not shown because of the large number of terms in the expressions. For example, $$\phi_1 = \frac{1}{4}(a_1^2 + a_4^2)a_7^2 \int G_X^2 dt' + \quad (29)$$
$$\left[\frac{1}{4} a_8^2(a_1^2 + a_4^2) + a_7^2(a_2^2 + a_5^2) - a_7 a_8(a_1 a_2 + a_4 a_5)\right]\int G_Y^2 dt' +$$
$$\left[a_7^2(a_1 a_2 + a_4 a_5) - \frac{1}{2} a_7 a_8(a_1^2 a_4^2)\right]\int G_X G_Y dt'.$$

The $\phi_i$ are now simplified using the approximations $$\int G_X^2 dt' \approx \int G_Y^2 dt' \approx \frac{1}{2}\int G_0^{2'} dt' = \frac{1}{2} G_m^2 T_{eff}, \quad (30)$$

and $$\int G_X G_Y dt' \approx 0, \quad (31)$$

where $\sqrt{G_X^2 + G_Y^2}$, where $G_m$ is the maximum value of $G_0$, and where the warped time $T_{eff}$ is defined by equation (30). Equation (28) then becomes $$\phi_M = \frac{\gamma G_m^2 T_{eff}}{4B_0}(F_1 X^2 + F_2 Y^2 + F_3 Z^2 + F_4 YZ + F_5 XZ + F_6 XY), \quad (32)$$

-continued where $$F_1 = \frac{1}{4} (a_1^2 + a_4^2)(a_7^2 + a_8^2) + a_7^2(a_2^2 + a_5^2) - a_7 a_8(a_1 a_2 + a_4 a_5), \quad (33)$$

$$F_2 = \frac{1}{4} (a_2^2 + a_5^2)(a_7^2 + a_8^2) + a_9^2(a_1^2 + a_4^2) - a_7 a_8(a_1 a_2 + a_4 a_5), \quad (34)$$

$$F_3 = \frac{1}{4} (a_3^2 + a_6^2)(a_7^2 + a_8^2) + a_9^2(a_1^2 + a_2^2 + a_4^2 + a_5^2) - \quad (35)$$

$$a_7 a_9(a_1 a_3 + a_4 a_6) - a_8 a_9(a_2 a_3 + a_5 a_6),$$

$$F_4 = \frac{1}{2} (a_2 a_3 + a_5 a_6)(a_7^2 - a_8^2) + a_8 a_9(2a_1^2 + a_2^2 + 2a_4^2 + a_5^2) - \quad (36)$$

$$a_7 a_8(a_1 a_3 + a_4 a_6) - a_7 a_9(a_1 a_2 + a_4 a_5),$$

$$F_5 = \frac{1}{2} (a_1 a_3 + a_4 a_6)(a_8^2 - a_7^2) + a_7 a_9(a_1^2 + 2a_2^2 + a_4^2 + 2a_5^2) - \quad (37)$$

$$a_7 a_8(a_2 a_3 + a_5 a_6) - a_8 a_9(a_{17} a_2 + a_{47} a_5),$$

$$F_6 = -\frac{1}{2} (a_1 a_2 + a_4 a_5)(a_7^2 + a_8^2) + a_7 a_8(a_1^2 + a_2^2 + a_4^2 + a_5^2). \quad (38)$$

Equation (32) is equivalent to an effective frequency shift $f_M(X,Y,Z)$ given by $$f_M(X, Y, Z) = \frac{\gamma}{2\pi} \frac{G_m^2}{4B_0} (F_1 X^2 + F_2 Y^2 + F_3 Z^2 + F_4 YZ + F_5 XZ + F_6 XY) \quad (39)$$

and applied for a time $T_{eff}$.

The logical coordinates (X,Y,Z) for each pixel are determined as follows. First the corner points of the image are used to determine the laboratory coordinates of the center of the slice plane $(x_c, Y_c, z_c)$. These corner points give laboratory coordinates for three corners of the image plane. The coordinates of the two diagonally opposite corners are averaged to get $(x_c, y_c, z_c)$. The rotation matrix is then used to calculate the logical coordinates of the center of the slice plane $(X_c, Y_c, Z_c)$ Using equation (26) gives $$\begin{pmatrix} X_c \\ Y_c \\ Z_c \end{pmatrix} = \begin{pmatrix} a_1 & a_2 & a_3 \\ a_4 & a_5 & a_6 \\ a_7 & a_8 & a_9 \end{pmatrix}^{-1} \begin{pmatrix} x_c \\ y_c \\ z_c \end{pmatrix}. \quad (40)$$

Since A is an orthogonal matrix, $A^{-1}=A^T$, so that equation (40) becomes $$\begin{pmatrix} X_c \\ Y_c \\ Z_c \end{pmatrix} = \begin{pmatrix} a_1 & a_4 & a_7 \\ a_2 & a_5 & a_8 \\ a_3 & a_6 & a_9 \end{pmatrix} \begin{pmatrix} x_c \\ y_c \\ z_c \end{pmatrix}. \quad (41)$$

The logical coordinates of each pixel in the slice plane are then calculated using $(X_c, Y_c, Z_c)$, the field of view and matrix size. Note that $Z=Z_c$ for each pixel in a 2 D slice.

While the above discussion has been focused on MRI systems with superconducting magnets, the artifact reduction techniques are applicable to systems with non-superconduction magnets, such as permanent or resistive magnets, using the same principles with only some notational changes. For example, in some resistive magnets, the physical z-axis of the MRI system corresponds to the anterior/posterior direction of the patient instead of the superior/inferior direction as in the superconducting magnet. Thus, a coronal image, instead of an axial image, lies in the x-y plane and the spiral readout gradients introduce a z squared Maxwell term which gives a pure through-plane effect. This effect can be removed by exactly the same method as illustrated for the axial image in a superconducting magnet.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprising of $G_x$, $G_y$ and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data set is conveyed through the serial link 115 to the computer system 107 where it is stored in the disk memory 111. In response to commands received from the operator console 100, this image data set may be archived on the tape drive 112, or it may be further processed by the image processor 106 and conveyed to the operator console 100 and presented on the display 104.

Figure 2:
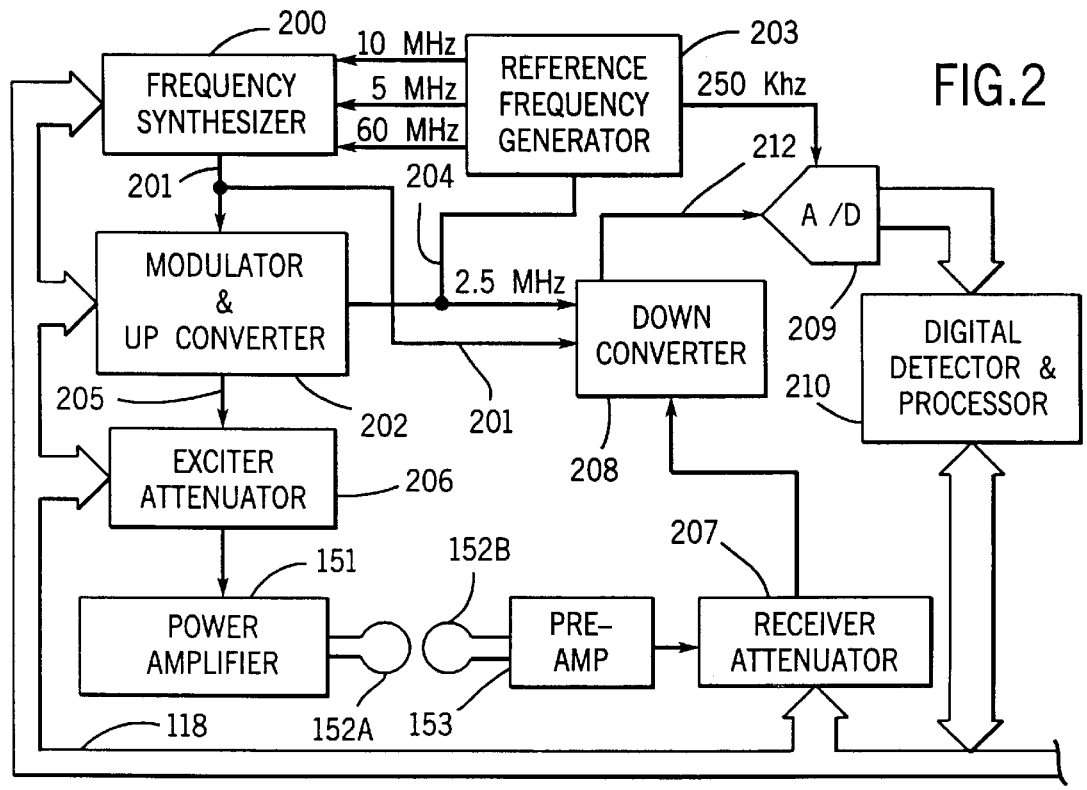
FIG. 2 is an electrical block diagram of the transceiver which forms part of the MRI system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further attenuates the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. The present invention may be implemented by controlling the frequency and phase of the 2.5 MHz reference signal on line 201 to correct for the frequency error $f_M$ given in equations (16) and (20) for axial and sagittal 2 D scans respectively. For the generalized oblique scan, the reference signal on line 201 may be controlled to correct the frequency error $f_M$ given in equation (21). After the RF pulses are produced during the spiral pulse sequence, for example, the frequency of the 2.5 MHz reference signal on line 201 is controlled by command signals from the pulse generator module 121 to make the corrective changes as the readout gradient depicted in FIG. 3 is played out.

Figure 3:
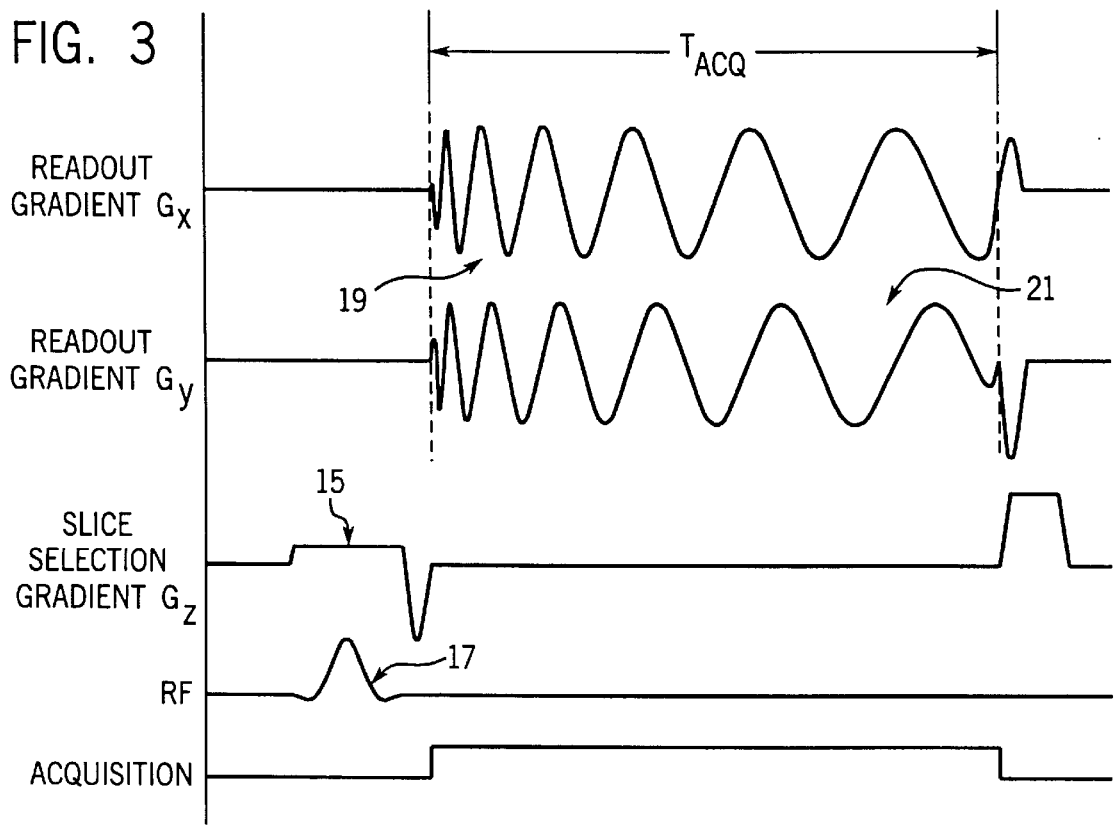
FIG. 3 is a graphic representation of a spiral pulse sequence.

Referring to FIG. 3, an axial, 2 D spiral scan is performed by exciting a slice using a $G_z$ slice selection gradient 15 and RF pulse 17 and then reading out the NMR signal produced during the time period $T_{acq}$. The sinusoidal $G_x$ and $G_y$ readout gradients 19 and 21 are applied to sample k-space in a spiral pattern during the readout period $T_{acq}$ and the acquired data is processed as described above. The through-plane Maxwell phase corrections can be made during this acquisition by controlling the RF reference signal 201 as described above, or the corrections can be made after the acquisition. In some cases it may be preferred to make the through-plane Maxwell corrections by controlling the RF reference frequency during acquisition and make the in-plane Maxwell corrections after the acquisition.

As is well known in the art, it is common practice to regrid the k-space data set acquired with a spiral scan prior to reconstructing an image using fast Fourier transformation. Such "gridding" is described, for example, by J. D. O'Sullivan, "A Fast Sinc Function Gridding Algorithm for Fourier Inversion In Computer Tomography", *IEEE Trans. Med. Imaging*, MI-6,200–207 (1985). The acquired data may be corrected for Maxwell term phase errors before gridding by multiplying the k-space data by the factor $$e^{i\phi_M(Z_c, t)},$$

where $\phi_M$ is given above in equation (24) and $Z_c$ is at the center of the slice. The k-space data can also be corrected after gridding by multiplying the regridded data by the factor $$e^{i\phi_M(Z_c, t(k_x, k_y))}.$$

We claim:

1. A method for correcting Maxwell term errors produced by an NMR system during the acquisition of an NMR image data array using a pulse sequence that samples k-space non-rectilinearly, the steps comprising:

a) inputting manually selectable scan parameters which indicate the location and orientation of a region of interest;

b) calculating a phase shift ($\phi$) for the NMR signal acquired during the pulse sequence based on the selected scan parameters and the Maxwell terms;

c) performing a scan to acquire NMR signals using the pulse sequence and the selected scan parameters;

d) correcting the phase of the NMR signals acquired during the scan by offsetting the phase therein with the calculated phase shift ($\phi$); and e) reconstructing an image with the corrected NMR signals.

2. The method as recited in claim 1 in which the non-rectilinear sampling of k-space is a spiral pattern.

3. The method as recited in claim 1 in which step d) is performed by:
   calculating a frequency correction ($f_M$) based on the calculated phase shift ($\phi$); and
   demodulating each acquired NMR signal with a frequency signal that is altered in frequency by the frequency correction ($f_M$).

4. The method as recited in claim 1 in which step d) is performed by:
   calculating a through-plane phase error $\phi_t$; and calculating an in-plane phase error $\phi_i$.

5. The method as recited in claim 2 in which step d) is performed by:
   calculating a frequency correction ($f_M$) based on the calculated phase correction ($\phi$); and demodulating each acquired NMR signal with a reference signal that is altered in frequency by the frequency correction ($f_M$).

6. The method as recited in claim 5 in which the scan acquires NMR image data for a slice plane having an arbitrary orientation, and in which the correction frequency $f_M$ is calculated substantially as follows:

$$f_M(X, Y, Z) = \frac{\gamma}{2\pi} \frac{G_m^2}{4B_0} (F_1 X^2 + F_2 Y^2 + F_3 Z^2 + F_4 YZ + F_5 XZ + F_6 XY),$$

where $\gamma$ is the gyromagnetic constant, X, Y and Z are the coordinates of locations in the region of interest with two axes parallel to the slice plane orientation, $B_0$ is the magnitude of a polarizing magnetic field, $G_m$ is the maximum value of a gradient magnetic field produced during the acquisition of each NMR signal, where $F_1$, $F_2$, $F_3$, $F_4$, $F_5$ and $F_6$ are constants which depend on the slice plane orientation, and where $f_M$ is applied for a time $T_{eff}$ given by $$T_{eff}(t) = \frac{1}{G_m^2} \int_0^t G_o^2(t') dt'$$

where $G_o(t')$ is the value of the gradient magnetic field during the acquisition of the NMR signal over the time interval 0 to t.

7. The method as recited in claim 5 in which the scan acquires NMR image data for a slice plane having an axial orientation with respect to a z-axis in the NMR system, and the correction frequency is calculated substantially as follows:

$$f_M = \frac{\gamma G_0^2 z^2}{4\pi B_0}$$

where $\gamma$ is the gyromagnetic constant, z is the location of the axial slice plane along the z-axis, $B_o$ is the magnitude of a polarizing magnetic field, and $G_m$ is the value of a gradient magnetic field during the acquisition of the NMR signal.

8. The method as recited in claim 5 in which the scan acquires NMR image data for a slice plane having a sagittal orientation with respect to an x-axis, y-axis and z-axis in the NMR system, and the correction frequency is calculated substantially as follows:

$$f_M = \frac{\gamma G_0^2}{8\pi B_0} \left( z^2 + \frac{y^2}{4} + \frac{x^2}{4} \right)$$

where $\gamma$ is the gyromagnetic constant, x, y and z are the coordinates of the region of interest, $B_o$ is the magnitude of a polarizing magnetic field, and $G_o$ is the value of a gradient magnetic field during the acquisition of the NMR signal.

9. The method as recited in claim 1 in which the NMR image data array acquired during the scan is a two-dimensional array.

10. The method as recited in claim 1 in which the NMR image data array acquired during the scan is a three-dimensional array.

* * * * *